United States Patent [19]
Wilson et al.

[11] Patent Number: 4,988,831
[45] Date of Patent: Jan. 29, 1991

[54] STRAIN RELIEF APPARATUS FOR RELIEVING STRAIN ON A CABLE OF AN ELECTRONIC DEVICE

[75] Inventors: Hillis L. Wilson; Peter W. Yaichuk, both of Groton, N.Y.

[73] Assignee: NCR Corporation, Dayton, Ohio

[21] Appl. No.: 413,657

[22] Filed: Sep. 28, 1989

[51] Int. Cl.$^5$ .......................................... H02G 15/07
[52] U.S. Cl. ................................. 174/65 R; 174/135; 439/456
[58] Field of Search .................... 174/65 R, 65 G, 135; 248/56; 439/449, 456, 457, 458, 459

[56] References Cited

U.S. PATENT DOCUMENTS

| | | |
|---|---|---|
| 2,544,343 | 3/1951 | Miller . |
| 3,057,001 | 10/1962 | Rapata . |
| 3,855,567 | 12/1974 | Harms et al. . |
| 3,879,571 | 4/1975 | Reed . |
| 4,081,659 | 3/1978 | Kemp . |
| 4,095,870 | 6/1978 | Mathe . |
| 4,101,189 | 7/1978 | Moser et al. . |
| 4,139,727 | 2/1979 | Kuballa . |
| 4,210,380 | 7/1980 | Brzostek . |
| 4,367,909 | 1/1983 | Shatto, Jr. et al. . |
| 4,680,425 | 7/1987 | Speraw . |

FOREIGN PATENT DOCUMENTS

| | | | |
|---|---|---|---|
| 3413254 | 10/1985 | Fed. Rep. of Germany | 174/135 |
| 3542871 | 6/1987 | Fed. Rep. of Germany | 174/135 |
| 2558016 | 7/1985 | France | 174/135 |
| 1033247 | 6/1966 | United Kingdom | 439/458 |

Primary Examiner—Laramie E. Askin
Attorney, Agent, or Firm—Wilbert Hawk, Jr.; Albert L. Sessler, Jr.; Elmer Wargo

[57] ABSTRACT

A strain relief apparatus for relieving strain on a cable of an electrical device having a housing with a notched-out portion therein. The strain relief apparatus is generally planar and is mounted directly into the notched-out portion. The strain relief apparatus has a U-shaped channel which is dimensioned to provide an interference fit with the cable after the cable is mounted therein. The design of the strain relief apparatus introduces bends in the cable to further facilitate strain relief if, for example, the cable is accidentally jerked or pulled.

13 Claims, 3 Drawing Sheets

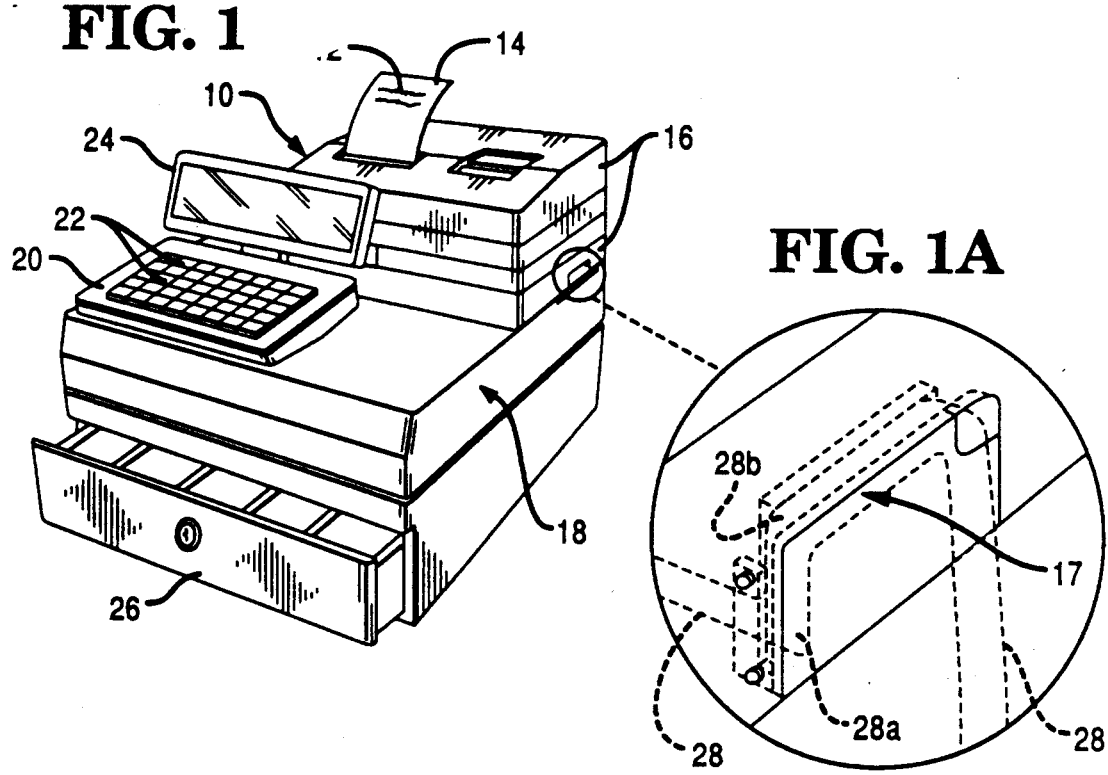
FIG. 1
FIG. 1A
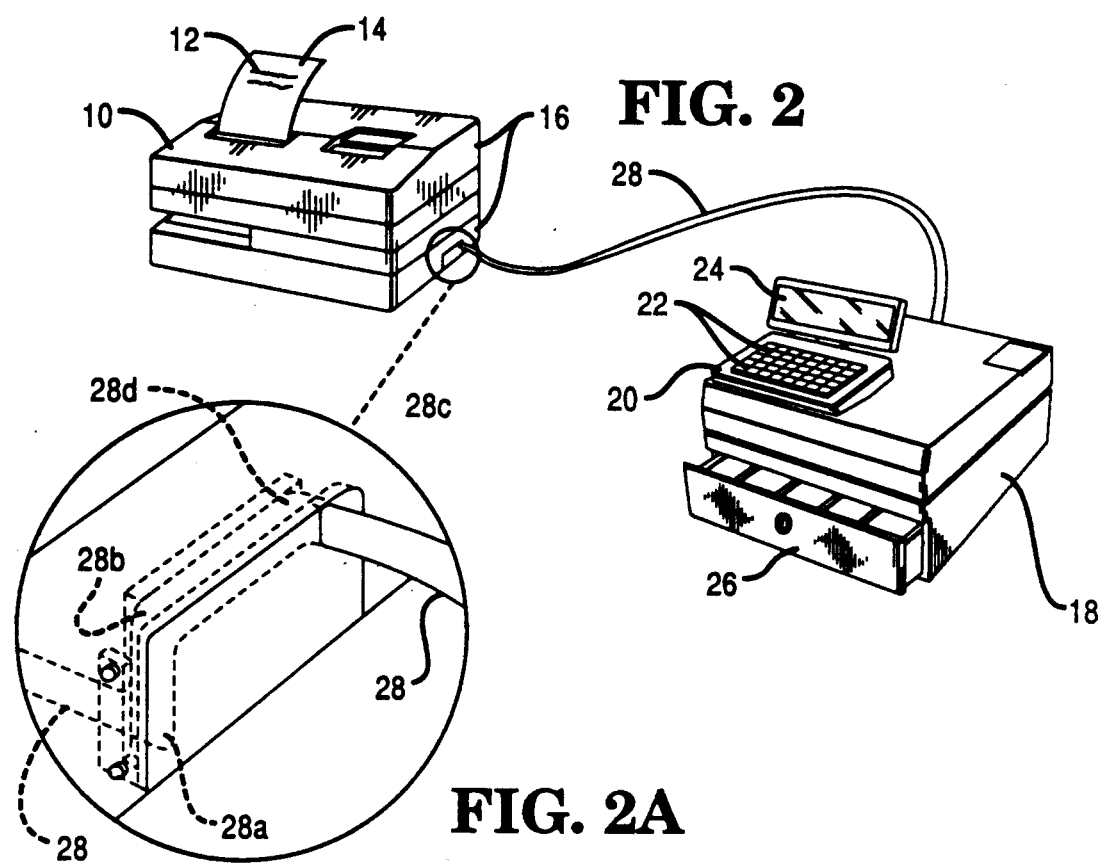
FIG. 2
FIG. 2A

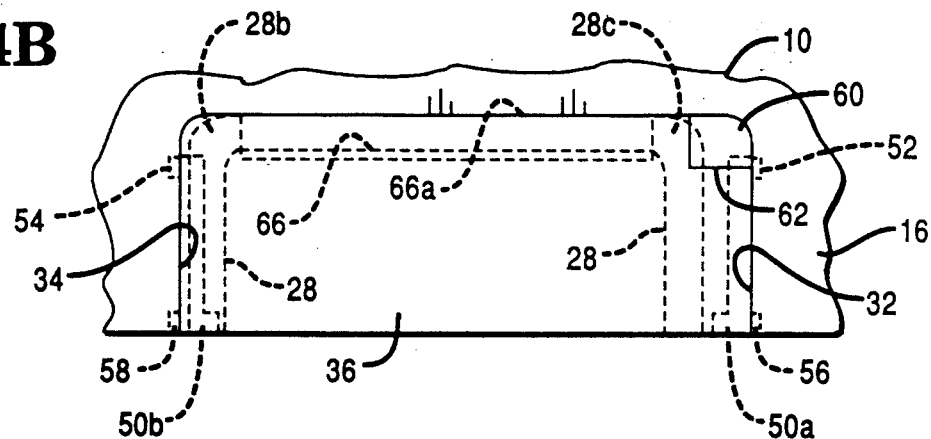
FIG. 4B
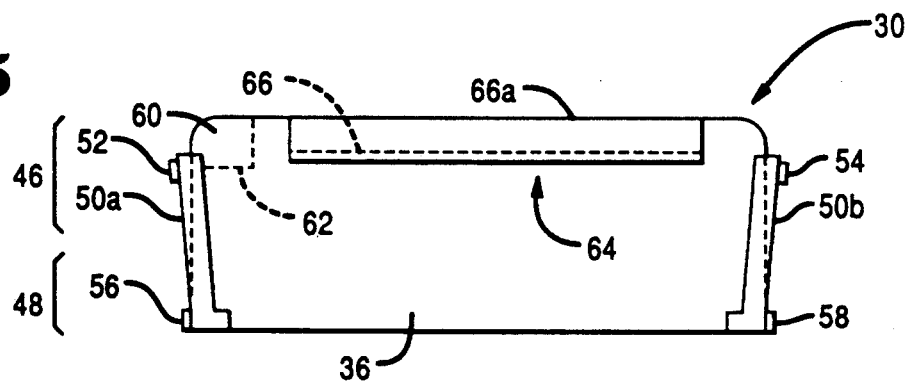
FIG. 5
FIG. 6
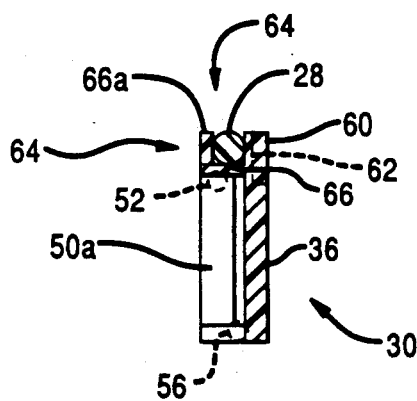
FIG. 7
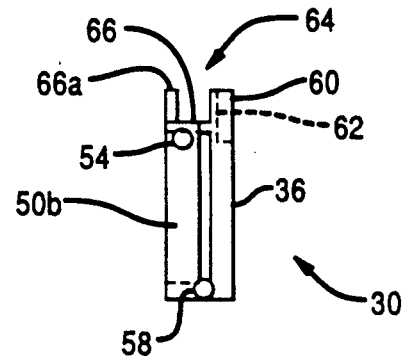
FIG. 8
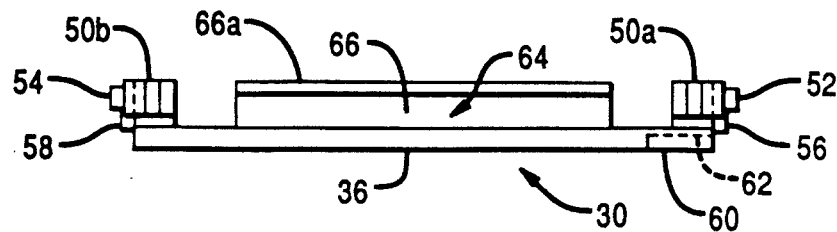

STRAIN RELIEF APPARATUS FOR RELIEVING STRAIN ON A CABLE OF AN ELECTRONIC DEVICE

BACKGROUND OF THE INVENTION

1. Field of the Invention

This invention relates to a strain relief apparatus and more particularly to a strain relief apparatus for relieving strain on a cable of an electronic or electrical device.

2. Description of Related Art

In the computer industry, it is important that a business machine, such as a printer, for example, be capable of being connected or interfaced to other electrical equipment. It is customary to connect the printer to other electrical equipment by using a cable. Typically, the cable would pass through an aperture in the housing of the printer and would then be connected to another business machine, such as a point of sale (POS) terminal. In order to relieve strain on the cable, business machines in the prior art would have, for example, metal clamps which would be separately mounted over the cable and onto the housing. Alternatively, a plastic or rubber clamp may be molded directly into the cable itself. These strain relief apparatuses of the prior art require an inventory of metal clamps or specially molded cables and screws. In addition, these types of strain relief apparatuses also require additional steps in order to complete the assembly and manufacturing of the business machine.

A business machine which provides a strain relief for a cable without using clamps and which also provides a strain relief which can be incorporated into the existing access or cabinet door of the business machine would be most desirable. Another desirable attribute of an access or cabinet door is that a cable may be routed therethrough with relative ease to enable the business machine to easily interface remotely positioned electrical equipment.

SUMMARY OF THE INVENTION

An object of this invention is to provide a strain relief apparatus which relieves strain on a cable of an electronic device.

Another object of this invention is to provide a strain relief apparatus that does not require the use of separate clamps or parts.

Another object of this invention is to provide a strain relief apparatus which facilitates easy mounting and removal of the cable in the strain relief apparatus.

Another object of this invention is to provide a planar member which is part of the housing of an electronic device which facilitates easy mounting and removal of the cable in the strain relief apparatus.

In one aspect of the invention, it includes: a strain relief apparatus for relieving strain on a cable of an electrical device, the electrical device having a housing, the strain relief apparatus comprising: a body which is generally planar; and mounting means secured to the body for detachably mounting the body to the housing; the body having a cable receiving means for receiving the cable and also for causing at least one bend in the cable so as to secure the cable to the body; the cable receiving means restricting movement of the cable when the cable is received by the cable receiving means and the strain relief apparatus is mounted to the housing of the electrical device.

In another aspect of the invention, it includes: a strain relief apparatus for relieving strain on a cable of an electrical device, the electrical device having a housing, the strain relief apparatus comprising: a planar member; and mounting means secured to the planar member for detachably mounting the planar member to the housing; the planar member having a generally U-shaped cable receiving means for receiving the cable, the generally U-shaped cable receiving means also having means for causing at least one bend in the cable; the generally U-shaped cable receiving means also being dimensioned to provide an interference fit with the cable when the cable is inserted in the generally U-shaped cable receiving means.

In yet another aspect of this invention, it includes: an electrical device having a cable, the electrical device comprising: a housing having a generally planar surface with a notched-out portion therein, the notched-out portion forming opposed first and second walls; and a strain relief member for relieving strain on the cable; the strain relief member comprising: a planar member; mounting means secured to the planar member for detachably mounting the planar member to the first and second walls of the housing; the planar member having a generally U-shaped cable receiving means for receiving the cable, the cable receiving means causing at least one bend in the cable and also being dimensioned to provide an interference fit with the cable when the cable is inserted in the generally U-shaped cable receiving means and the planar member is mounted to the housing.

Some advantages of this invention are that it is easy to manufacture and inexpensive in cost.

Another advantage of this invention is that it provides a planar member and a cable strain relief in a one-piece construction without the use of separate parts.

Yet another advantage of this invention is that it is easy to construct so that the cable can be mounted inside of the strain relief member without interfering with the mounting elements of the strain relief apparatus.

With these and other objects and advantages, which will become apparent from the following description, in view, the invention includes certain novel features of construction and combinations of parts, a preferred form or embodiment of which is hereinafter described with reference to the drawing which accompanies and forms a part of this specification.

BRIEF DESCRIPTION OF THE DRAWING

FIG. 1 is a perspective view of a printer, showing how the printer can be mounted directly on top of a terminal;

FIG. 1A is an enlarged view, showing a strain relief member included in FIG. 1 and also showing (in dashed outline) how the strain relief member is designed to facilitate introducing a U-shaped bend in the cable to provide strain relief;

FIG. 2 is another perspective view, showing how the printer can be remotely located from the terminal;

FIG. 2A is an enlarged view, showing the strain relief member included in FIG. 1 having a frangible portion removed therefrom to provide an opening through which the cable can pass to a remotely located terminal and also showing (in dashed outline) the bends in the cable which result when the cable is routed therethrough;

FIGS. 4A and 4B are fragmentary views of the printer, showing the strain relief member in dismounted and mounted positions, respectively, and also showing how the strain relief member causes the cable to bend into a U-shape when the strain relief member is mounted in the printer housing;

FIG. 5 is a view looking from the direction of arrow B of FIG. 3, showing first and second L-shaped mounting members having first and second projections, respectively, and also showing a cable receiving means;

FIG. 6 is a cross-sectional view of the strain relief member, taken along the line 6—6 of FIG. 4A, showing the cable receiving means in the form of a generally U-shaped channel which is used to retain the cable in a mounted position in the strain relief member;

FIG. 7 is a left side view of the strain relief member as viewed from FIG. 3; and FIG. 8 is a top view of the strain relief member as viewed from FIG. 3 showing the U-shaped channel and the first, second, third, and fourth projections used to secure the strain relief member to the housing.

DESCRIPTION OF THE PREFERRED EMBODIMENT

Figure 3:
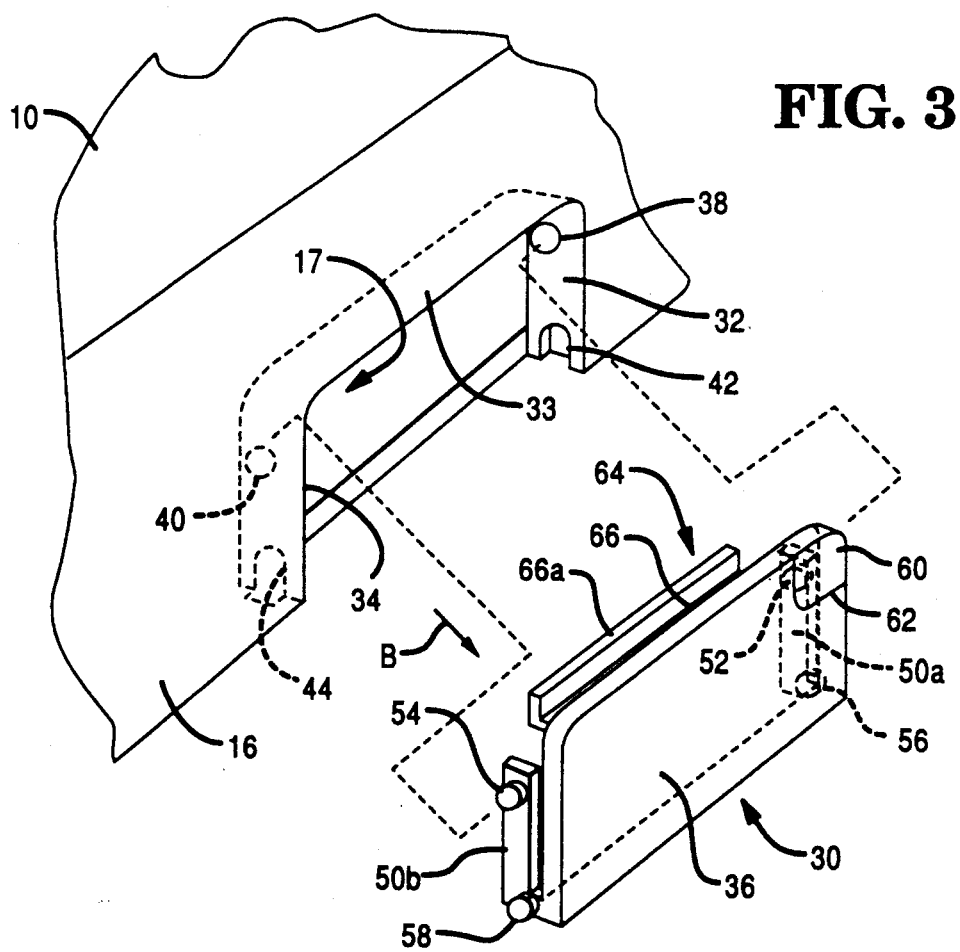
FIG. 3 is a view of a portion of the printer, showing how the strain relief member is mounted in the printer housing.

FIG. 1 is a perspective view of a printer 10. One function of the printer 10 is to print data 12 on receipt paper 14. The printer 10 comprises a housing 16 which can be mounted directly on top of a terminal 18 (FIG. 1). Alternatively, the printer 10 can be remotely positioned from the terminal 18, as is shown in FIG. 2. The printer 10 includes a cable 28 which operatively couples the electrical components (not shown) in printer 10 to the electrical components (not shown) in terminal 18. It is to be noted that a typical POS terminal 18 includes a keyboard 20 having a plurality of keys 22, a display 24, and a cash drawer 26. At the conclusion of a sales transaction, for example, one of the keys 22 may be actuated which causes the cash drawer 26 to open and also causes a total to be printed on the receipt paper 14 and displayed on the display 24.

The housing 16 of printer 10 has a notched-out portion 17 which is best shown in FIG. 3. Notice that the notched-out portion 17 forms a top wall 33, and it also forms a first wall 32 in an opposed relationship with a second wall 34. The first and second walls 32 and 34 have therein first and second apertures 38 and 40, respectively. The first and second walls 32 and 34 also have therein first and second slots 42 and 44, respectively, as best shown in FIG. 3. The function of the first and second apertures 38 and 40 and the first and second slots 42 and 44 will be described later herein.

Figure 4A:
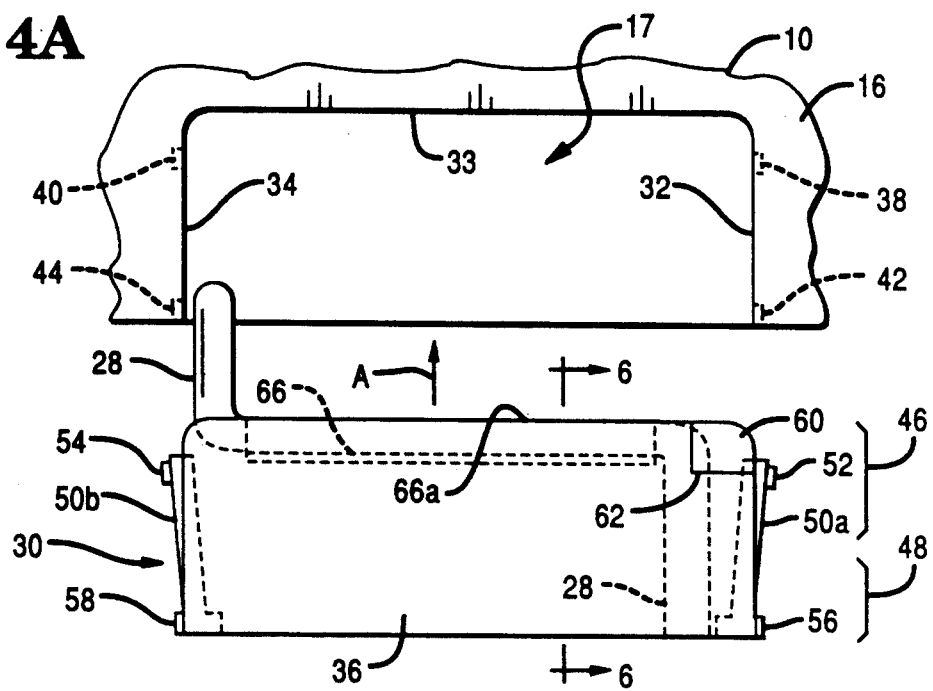

As best shown in FIGS. 4A and 4B, a strain relief member 30 made according to this invention is slid in the direction of arrow A in FIG. 4A into the notched-out portion 17 of the housing 16, as will be described hereinafter. In a preferred embodiment, the strain relief member 30 includes a planar member 36 having general top and bottom portions 46 and 48, respectively. A mounting means, which is comprised of first and second L-shaped mounting members 50a and 50b, is secured to the bottom portion 48 (FIG. 5) of the planar member 36 and is used to detachably mount the planar member 36 to the housing 16. The first and second L-shaped mounting members 50a and 50b project from opposed sides of the bottom portion 48 (FIG. 5) and are resiliently biased away from each other to facilitate mounting and dismounting the planar member 36 to and from the housing 16, as will be described later herein.

In a preferred embodiment, the first and second L-shaped mounting members 50a and 50b each lie in planes that are generally perpendicular to the plane of the planar member 36, as shown in FIG. 5. As best shown in FIG. 4B, the first and second L-shaped mounting members 50a and 50b become operatively associated with the first and second opposed walls 32 and 34, respectively, when the strain relief member 30 is mounted in the housing 16. The first and second L-shaped mounting members 50a and 50b have first and second projections 52 and 54, respectively, extending therefrom. The first and second projections 52 and 54 have shapes which generally complement the shapes of the first and second apertures 38 and 40 (FIG. 3), respectively. The first and second projections 52 and 54 engage the first and second apertures 38 and 40 in the first and second walls 32 and 34, respectively, to retain the planar member 36 in a mounted position in the housing 16. As best shown in FIGS. 4B and 5, the planar member 36 also includes third and fourth projections 56 and 58, respectively. The third and fourth projections 56 and 58 engage and coact with the first and second slots 42 and 44 (FIG. 3), respectively, to prevent the bottom portion 48 of the planar member 36 from pivoting away from the housing 16 when the planar member 36 is mounted thereto, as described below.

The planar member 36 of the strain relief member 30 includes a cable receiving means 64 (FIGS. 6, 7, and 8) for receiving the cable 28. In a preferred embodiment, the cable receiving means 64 is a generally U-shaped channel 66 which is dimensioned to provide an interference fit with the cable 28 when the cable 28 is press-fitted therein. The U-shaped channel 66 has a top edge 66a which becomes positioned in a predetermined relationship to the top wall 33 when the strain relief member 30 is mounted in the housing 16 such that the cable 28 cannot work its way out of the U-shaped channel 66, as will be described later herein. As best shown in FIG. 1A, the cable 28 is threaded from the electrical components (not shown) in the printer 10 into the notched-out portion 17 towards the bottom portion 48 of the planar member 36. The cable 28 is threaded upwardly (as viewed in FIG. 1A), thereby causing a bend 28a therein and adjacent to the second L-shaped mounting member 50b. The cable 28 is then press-fitted into the cable receiving means 64 which causes another bend 28b in the cable 28. In a preferred embodiment, the cable 28 is threaded downwardly adjacent to the first L-shaped mounting member 50a causing a bend 28c therein (as best shown in FIG. 4B). The end of the cable 28 is then connected to the electrical components (not shown) in the terminal 18. Notice that this design of the cable receiving means 64 and first and second L-shaped mounting members 50a and 50b facilitates introducing a U-shaped bend in the cable 28 to further provide strain relief on the cable 28 in the event the cable 28 is jerked or pulled.

The planar member 36 also includes a frangible portion 60 (FIGS. 4B, 5, and 8) which is delineated by a line of weakness 62. The frangible portion 60 can be removed or broken away from the planar member 36 with a pair of pliers (not shown), for example, in order to provide an opening (FIG. 2A) through which a bend 28d in the cable 28 can pass from the printer 10 to the terminal 18 when the terminal 18 is located remotely from the printer 10.

The operation and use of the strain relief member 30 will now be described. When it is desirable to relieve strain on the cable 28 of the printer 10, the cable 28 is bent and positioned in the U-shaped channel 66 as previously described. After the cable has been positioned in strain relief member 30, the strain relief member 30 is positioned in front of and slightly below the notched-out portion 17 of the housing 16, as shown in FIG. 4A. The resilient first and second L-shaped mounting members 50a and 50b are manually biased towards each other while the top portion 46 of the planar member 36 is slid upwardly into the notched-out portion 17 in the direction of arrow A in FIG. 4A. As the planar member 36 is moved upwardly, the third and fourth projections 56 and 58 engage and coact with the first and second slots 42 and 44, respectively, prior to the first and second projections 52 and 54 being resiliently urged into the first and second apertures 38 and 40, respectively, to retain the strain relief member 30 in a mounted position in the housing 16. Notice that the third and fourth projections 56 and 58 engage and coact with the first and second slots 42 and 44 to prevent the bottom portion 48 of planar member 36 from pivoting away from the housing 16 after the cable receiving means 64 is mounted in the housing 16. In a preferred embodiment, the top edge 66a of the U-shaped channel 66 is positioned in an opposed relationship from the top wall 33 such that the cable 28 cannot work its way out of the U-shaped channel 66. The strain relief member 30 is removed from the housing 16 by manually biasing the first and second L-shaped mounting members 50a and 50b towards each other with a tool, like a bladed member, and sliding the strain relief member 30 downwardly (as viewed in FIG. 4A) out of the notched-out portion 17.

In a preferred embodiment, the strain relief apparatus 30 is first mounted in the notched-out portion 17 of housing 16, and then the printer 10 is mounted on top of the terminal 18 (FIG. 1). If it is desirable to locate the terminal 18 remotely from the printer 10 (FIG. 2), then the procedure for mounting the strain relief member 30 in the housing 16 would be the same as described above, except that the cable 28 is routed to terminal 18 through the opening provided by the removed frangible portion 60, as best shown in FIG. 2A.

In a preferred embodiment, a typical strain relief member 30 has a length of 3.375 inches and a height of 1.375 inches. The planar member 36 and L-shaped mounting members 50a and 50b have typical thicknesses of 0.125 inch, and the first, second, third, and fourth projections 52, 54, 56, and 58, respectively, have diameters of 0.250 inch. The U-shaped channel 66 has a typical length of 2.375 inches and a typical internal dimension of 0.290 inch, and the cable 28 has a typical diameter of 0.300 inch. In a preferred embodiment, the strain relief member 30 is of a one-piece construction which is molded from any suitable plastic material.

Various changes or modifications in the invention described may occur to those skilled in the art without departing from the spirit or scope of the invention. The above description of the invention is intended to be illustrative and not limiting, and it is not intended that the invention be restricted thereto but that it be limited only by the true spirit and scope of the appended claims.

What is claimed is:

1. A strain relief apparatus for relieving strain on a cable of an electrical device, said electrical device having a housing, said strain relief apparatus comprising:
   a body which is generally planar, said body comprising a top portion and a bottom portion; and
   mounting means secured to said bottom portion of said body for detachably mounting said body to the housing;
   said body having a cable receiving means for receiving the cable and also for causing at least one bend in the cable so as to secure the cable to the body;
   said cable receiving means restricting movement of the cable when the cable is received by the cable receiving means and the strain relief apparatus is mounted to the housing of the electrical device; and
   said cable receiving means including a generally U-shaped channel which is dimensioned to provide an interference fit for the cable in order to retain the cable in the cable receiving means; said generally U-shaped channel being secured to said top portion so as to coact with said housing in order to facilitate retaining the cable in the U-shaped channel when the strain relief apparatus is mounted to the housing of the electrical device.

2. The strain relief apparatus as claimed in claim 1 in which the housing includes a generally planar surface having a notched-out portion therein, said notched-out portion forming first and second opposed walls having first and second apertures therein, respectively;
   said mounting means comprising first and second L-shaped mounting members which project from opposed sides of said bottom portion, said first and second L-shaped mounting members being resiliently biased away from each other to facilitate mounting and dismounting the body to and from the housing; and
   said first and second L-shaped mounting members having first and second projecting members, respectively, for cooperating with said first and second apertures, respectively, to retain said body in a mounted position in the housing.

3. A strain relief apparatus for relieving strain on a cable of an electrical device, said electrical device having a housing, said strain relief apparatus comprising:
   a body which is generally planar, said body comprising a top portion and a bottom portion; and
   mounting means secured to said bottom portion of said body for detachably mounting said body to the housing;
   said body having a cable receiving means for receiving the cable and also for causing at least one bend in the cable so as to secure the cable to the body;
   said cable receiving means restricting movement of the cable when the cable is received by the cable receiving means and the strain relief apparatus is mounted to the housing of the electrical device; and
   said top portion having a frangible portion which can be removed from said body to provide an aperture through which the cable can pass to thereby provide a second bend in the cable.

4. A strain relief apparatus for relieving strain on a cable of an electrical device, said electrical device having a housing including a generally planar surface, said strain relief apparatus comprising:
   a body which is generally planar, said body comprising a top portion and a bottom portion; and mounting means secured to said bottom portion of said body for detachably mounting said body to the housing;

said body having a cable receiving means for receiving the cable and also for causing at least one bend in the cable so as to secure the cable to the body;

said cable receiving means restricting movement of the cable when the cable is received by the cable receiving means and the strain relief apparatus is mounted to the housing of the electrical device;

said mounting means comprising first and second L-shaped mounting members which project from opposed sides of said bottom portion, said first and second L-shaped mounting members being resiliently biased away from each other to facilitate mounting and dismounting the body to and from the housing;

said generally planar surface having a notched-out portion therein and said notched-out portion forming first and second opposed walls having first and second apertures therein, respectively, said first and second L-shaped mounting members having first and second projecting members, respectively, for cooperating with said first and second apertures, respectively, to retain said body in a mounted position in the housing; and said first and second opposed walls having first and second slots therein, respectively, said mounting means further comprising third and fourth projecting members which are also secured to said bottom portion and which are for coacting with and for engaging said first and second slots, respectively, in order to prevent the bottom portion from pivoting away from the housing when said body has been mounted thereto.

5. The strain relief apparatus as claimed in claim 4 in which the strain relief apparatus is of a one-piece construction and is made from plastic material.

6. A strain relief apparatus for relieving strain on a cable of an electrical device, said electrical device having a housing, said strain relief apparatus comprising:

a planar member, said planar member comprising a top portion and a bottom portion; and mounting means secured to said bottom portion of said planar member for detachably mounting said planar member to the housing;

said planar member having a generally U-shaped cable receiving means for receiving the cable, said generally U-shaped cable receiving means also having means for causing at least one bend in the cable; said generally U-shaped cable receiving means also being dimensioned to provide an interference fit with the cable when the cable is inserted in the generally U-shaped cable receiving means;

said mounting means comprising first and second L-shaped mounting members which project from opposed sides of said bottom portion, said first and second L-shaped mounting members being resiliently biased away from each other to facilitate mounting and dismounting the planar member to the housing;

said first and second L-shaped mounting members having first and second projections extending therefrom, respectively;

said housing having a planar surface with a notched-out portion forming first and second opposed walls, said first and second opposed walls having therein first and second apertures, respectively;

said first and second projections being for engaging said first and second apertures, respectively, to retain said planar member in a mounted position in the housing when the planar member is mounted thereto;

said first and second opposed walls having therein first and second slots, respectively; and said mounting means further comprising third and fourth projections for engaging and coacting with said first and second slots, respectively, in order to prevent said bottom portion of said planar member from pivoting away from the housing when said planar member is mounted thereto.

7. A strain relief apparatus for relieving strain on a cable of an electrical device, said electrical device having a housing, said strain relief apparatus comprising:

a planar member, said planar member comprising a top portion and a bottom portion; and mounting means secured to said bottom portion of said planar member for detachably mounting said planar member to the housing;

said planar member having a generally U-shaped cable receiving means for receiving the cable, said generally U-shaped cable receiving means also having means for causing at least one bend in the cable; said generally U-shaped cable receiving means also being dimensioned to provide an interference fit with the cable when the cable is inserted in the generally U-shaped cable receiving means; and said top portion having a frangible portion which can be removed from said planar member to provide an opening through which the cable can pass.

8. The strain relief apparatus as claimed in claim 7 in which the strain relief apparatus is of a one-piece construction and is molded from plastic material.

9. An electrical device having a cable, said electrical device comprising:

a housing having a generally planar surface with a notched-out portion therein, said notched-out portion forming opposed first and second walls; and a strain relief member for relieving strain on the cable; said strain relief member comprising:

a planar member; and mounting means secured to said planar member for detachably mounting said planar member to said first and second walls of the housing;

said planar member having a generally U-shaped cable receiving means for receiving the cable, said cable receiving means being adapted to cause at least one bend in the cable and also being dimensioned to provide an interference fit with the cable with the cable is inserted in the generally U-shaped cable receiving means and the planar member is mounted to the housing;

said planar member comprising a top and a bottom portion, said mounting means secured to said bottom portion of said planar member and said mounting means comprising first and second L-shaped mounting members which project from opposed sides of said bottom portion, said first and second L-shaped mounting members being resiliently biased away from each other to facilitate mounting and dismounting the planar member to and from the housing; and said first and second opposed walls also having therein first and second slots, respectively, and said mounting means further comprising third and fourth projections for engaging and coacting with said first and second slots, respectively, in order to prevent said bottom portion from pivoting away from said housing when said planar member has been mounted thereto.

10. An electrical device having a cable, said electrical device comprising:
a housing having a generally planar surface with a notched-out portion therein, said notched-out portion forming opposed first and second walls; and
a strain relief member for relieving strain on the cable; said strain relief member comprising:
a planar member; and
mounting means secured to said planar member for detachably mounting said planar member to said first and second walls of the housing;
said planar member having a generally U-shaped cable receiving means for receiving the cable, said cable receiving means being adapted to cause at least one bend in the cable and also being dimensioned to provide an interference fit with the cable with the cable is inserted in the generally U-shaped cable receiving means and the planar member is mounted to the housing; and
said planar member including a top portion and a bottom portion, said top portion including a frangible portion which can be removed from said planar member to provide an opening through which the cable can pass.

11. The electrical device as claimed in claim 10 in which said strain relief member is of a one-piece construction and is molded from plastic material.

12. An electrical device having a cable, said electrical device comprising:
a housing having a generally planar surface with a notched-out portion therein, said notched-out portion forming opposed first and second walls; and
a strain relief member for relieving strain on the cable; said strain relief member comprising:
a planar member; and
mounting means secured to said planar member for detachably mounting said planar member to said first and second walls of the housing;
said planar member comprising a top portion and a bottom portion, said mounting means secured to said bottom portion of said planar member and said mounting means comprising first and second L-shaped mounting members which project from opposed sides of said bottom portion, said first and second L-shaped mounting members having first and second projections, respectively, extending therefrom and being resiliently biased away from each other to facilitate mounting and dismounting the planar member to and from the housing;
said planar member also comprising a generally U-shaped cable receiving means secured to said top portion for receiving the cable, said cable receiving means being adapted to cause at least one bend in the cable and also being dimensioned to provide an interference fit with the cable when the cable is inserted in the generally U-shaped cable receiving means;
said cable receiving means being shaped to cause said cable to bend into a U-shaped configuration when said cable is routed adjacent to said first and second L-shaped mounting members and into said U-shaped cable receiving means;
said first and second opposed walls having first and second apertures, respectively, therein, with said first and second projections engaging said first and second apertures, respectively, to retain said planar member in a mounted position in the housing when the planar member is mounted thereto;
said first and second opposed walls also having therein first and second slots, respectively, and said mounting means further comprising third and fourth projections which engage and coact with said first and second slots, respectively, to prevent said bottom portion from pivoting away from said housing when said planar member has been mounted thereto.

13. An electrical device having a cable, said electrical device comprising: a housing having a generally planar surface with a notched-out portion therein, said notched-out portion forming opposed first and second walls; and
a strain relief member for relieving strain on the cable; said strain relief member comprising:
a planar member; and
mounting means secured to said planar member for detachably mounting said planar member to said first and second walls of the housing;
said planar member comprising a top portion and a bottom portion, said mounting means secured to said bottom portion of said planar member and said mounting means comprising first and second L-shaped mounting members which project from opposed sides of said bottom portion, said first and second L-shaped mounting members having first and second projections, respectively, extending therefrom and being resiliently biased away from each other to facilitate mounting and dismounting the planar member to and from the housing;
said planar member also comprising a generally U-shaped cable receiving means secured to said top portion for receiving the cable, said cable receiving means being adapted to cause at least one bend in the cable and also being dimensioned to provide an interference fit with the cable when the cable is inserted in the generally U-shaped cable receiving means; and
said top portion of said planar member including a frangible portion which can be removed from said planar member to provide an opening through which the cable can pass.

* * * * *

UNITED STATES PATENT AND TRADEMARK OFFICE
CERTIFICATE OF CORRECTION

PATENT NO. : 4,988,831

DATED : Jan. 29, 1991

INVENTOR(S) : Hillis L. Wilson

It is certified that error appears in the above-identified patent and that said Letters Patent is hereby corrected as shown below:

Column 7, line 57, "opposed" should be --opposite--.

Column 8, line 53, "with" should be --when--.

Signed and Sealed this

Twenty-fifth Day of August, 1992

Attest:

DOUGLAS B. COMER

*Attesting Officer*    *Acting Commissioner of Patents and Trademarks*